(12) United States Patent
Lee et al.

(10) Patent No.: US 6,197,677 B1
(45) Date of Patent: Mar. 6, 2001

(54) METHOD OF DEPOSITING A SILICON OXIDE LAYER ON A SEMICONDUCTOR WAFER

(75) Inventors: Chin-Hui Lee, Taipei; Ting-Chi Lin, Miao-Li Hsien; Chih-Cheng Liu, Pan-Chiao, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/431,936

(22) Filed: Nov. 1, 1999

(51) Int. Cl.$^7$ ................................................ H01L 21/4763
(52) U.S. Cl. .................... 438/623; 438/778; 438/779; 438/787
(58) Field of Search ............................ 438/67, 778, 787, 438/623, 779

(56) References Cited

U.S. PATENT DOCUMENTS

| | | | |
|---|---|---|---|
| 5,210,056 | * 5/1993 | Pong et al. | 437/239 |
| 5,498,565 | * 3/1996 | Gocho et al. | 437/67 |
| 5,933,760 | * 8/1999 | Iyer et al. | 438/778 |
| 5,943,599 | * 8/1999 | Yao et al. | 438/623 |
| 6,004,886 | * 12/1999 | Houng et al. | 438/779 |

* cited by examiner

Primary Examiner—Matthew Smith
Assistant Examiner—V. Yevsikov
(74) Attorney, Agent, or Firm—Winston Hsu

(57) ABSTRACT

The present invention provides a method of depositing a silicon oxide layer on a semiconductor wafer. The semiconductor wafer comprises a plurality of transistors positioned on its surface. The method comprises performing a cleaning process on the semiconductor wafer by using an alkaline solution to make a more uniform deposition rate of the silicon oxide layer on the transistors and other areas over the surface of the semiconductor wafer, then performing a deposition process by employing ozone as a reactive gas to form a silicon oxide layer of even thickness and without voids.

7 Claims, 2 Drawing Sheets

METHOD OF DEPOSITING A SILICON OXIDE LAYER ON A SEMICONDUCTOR WAFER

BACKGROUND OF THE INVENTION

1. Field of the Invention

The present invention relates to a method of depositing a silicon oxide layer on a semiconductor wafer, and more particularly, to a method of depositing a silicon oxide layer on the transistors and other areas over the surface of the semiconductor wafer.

2. Description of the Prior Art

In semiconductor processing, some gases such as silane ($SiH_4$), tetra-ethyl-ortho-silicate (TEOS) and oxygen are used in a thin film deposition process to form a dielectric layer. The chemical reaction between the gases forms a thin film on the semiconductor wafer to provide electrical insulation between devices. Because the manufacturing technology of silicon oxide ($SiO_x$) is very well developed, a silicon oxide ($SiO_x$) layer is most frequently used as the dielectric layer in most semiconductor wafer processes. Atmospheric pressure chemical vapor deposition (APCVD) is usually employed in the prior art method. $O_3$ and TEOS are used as reactive gases to form the silicon oxide layer. This method is abbreviated as $O_3$-TEOS in the semiconductor industry. The silicon oxide layer formed by this method has good gap filling ability, so it is usually used in the inter-metal layer or inter-layer dielectric.

Please refer to FIG. 1. FIG. 1 is a sectional schematic diagram of silicon oxide layer 19 deposited on semiconductor wafer 11 according to the prior art. In the prior art method of forming silicon oxide layer 19, semiconductor wafer 11 is loaded on an APCVD machine to undergo an APCVD process by using the $O_3$-TEOS method. Silicon oxide layer 19 will then be formed on semiconductor wafer 11. The surfaces of each transistor on semiconductor wafer 11 are usually formed by many different materials, as shown in FIG. 1. The surface of semiconductor wafer 11 comprises silicon oxide layer 12 and polysilicon 13 which is filled inside silicon oxide layer 12. The deposition layer 19 on semiconductor wafer 11 and transistors is formed by gases mixed with TEOS and a predetermined amount of highly concentrated ozone.

However, highly concentrated ozone is very sensitive to the surfaces formed by different materials on the semiconductor wafer 10. The relative deposition rates of each material are as follows: Si >SiN>$SiO_2$ formed by a thermal oxidation process >$SiO_2$ formed by a deposition process. Consequently, the deposition rate of deposition layer 19 formed on the surface of the semiconductor wafer 11 will vary with the different surface materials. Hence, if highly concentrated ozone is used to perform the deposition process, silicon oxide layer 19 will form on semiconductor wafer 11 with uneven thicknesses, that will reduce the manufacturing yield.

Therefore, for solving the above problem caused by employing highly concentrated ozone as the reactive gas in the deposition process, the semiconductor industry usually creates a buffer layer on the semiconductor wafer first, in order to reduce the sensitivity of highly concentrated ozone. Please refer to FIG. 2. FIG. 2 is a sectional schematic diagram of silicon oxide layer 17 deposited on the semiconductor wafer 10 according to the prior art. The semiconductor wafer 10 comprises a plurality of transistors 12 positioned on its surface, wherein the transistors consist of Si, $SiO_2$ and SiN. In the prior art method, TEOS and a low concentration of ozone are injected to form the first silicon oxide layer 14 as a buffer layer on the semiconductor wafer 10. Then TEOS and highly concentrated ozone are injected to form the second silicon oxide layer 16 on the semiconductor wafer 10. The silicon oxide layer 17 consists, then, of the first silicon oxide layer 14 and the second silicon oxide layer 16, and is used as the dielectric layer.

For the silicon oxide layer 17 shown in FIG. 2, TEOS and a low concentration of ozone are injected as the reactive gases. Because a low concentration of ozone also has a low sensitivity characteristic, the first silicon oxide layer 14 will be formed on the semiconductor wafer 10 with a thin thickness. Then highly concentrated ozone and TEOS are injected to form the second silicon oxide layer 16 with a thick thickness and a uniform surface over the first silicon oxide layer 14. Because the second silicon oxide layer 16 is deposited on the surface of the first silicon oxide layer 14, which is a single material, the sensitivity of highly concentrated ozone to the semiconductor wafer 10 is uniform. Consequently, the second silicon oxide layer 16 forms as a flat surface.

However, the gap filling ability of the first silicon oxide layer 14 is very poor. Voids 18 are easily formed in trenches, or in places between devices during the deposition process. These defects can result in short circuits and reduce the reliability of the transistors on the semiconductor wafer 10, which increases production costs. Moreover, as the manufacturing technology improves, the design of line widths and line distances on the semiconductor wafer 10 decrease. The poor gap filling ability of the first silicon oxide layer 14 formed by the prior art method will cause more voids 18 on the semiconductor wafer 10 during the manufacturing process and will immensely effect the electrical performance of the semiconductor wafer 10.

SUMMARY OF THE INVENTION

It is therefore a primary objective of the present invention to provide a method of depositing a silicon oxide layer to solve the above mentioned problem.

In a preferred embodiment, the present invention provides a method of depositing a silicon oxide layer on a semiconductor wafer, the semiconductor wafer comprising a plurality of transistors positioned on its surface, the method comprising:

performing a cleaning process to the semiconductor wafer by using an alkaline solution; and performing a deposition process by employing ozone as a reactive gas to form a silicon oxide layer on the semiconductor wafer;

wherein the cleaning process performed on the semiconductor wafer with the alkaline solution causes the deposition rate of the silicon oxide layer on the transistors and other areas over the surface of the semiconductor wafer to be more uniform.

It is an advantage of the present invention that the method of depositing a silicon oxide layer can improve the gap filling ability of the silicon oxide layer to prevent voids that can cause short circuits.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERED EMBODIMENT

Figure 1:
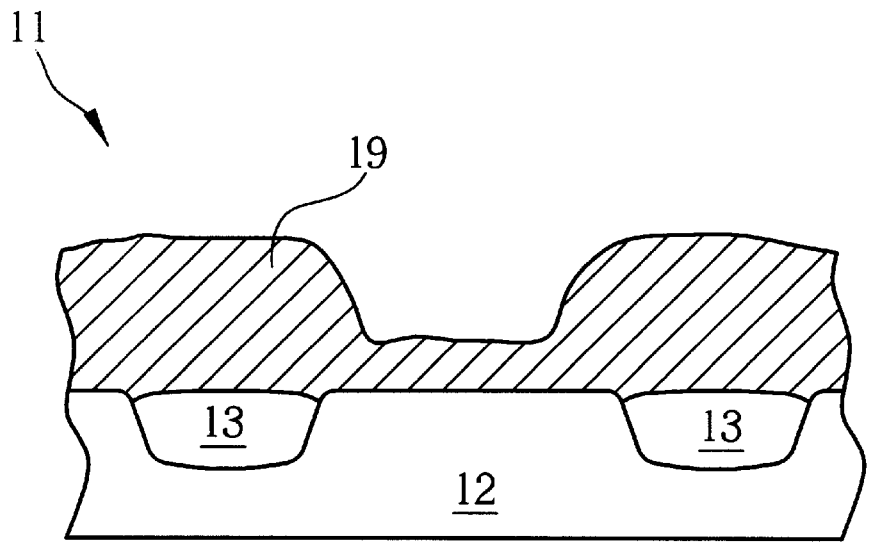
FIG. 1 and FIG. 2 are sectional schematic diagrams of a silicon oxide layer deposited on a semiconductor wafer according to the prior art.
Figure 2:
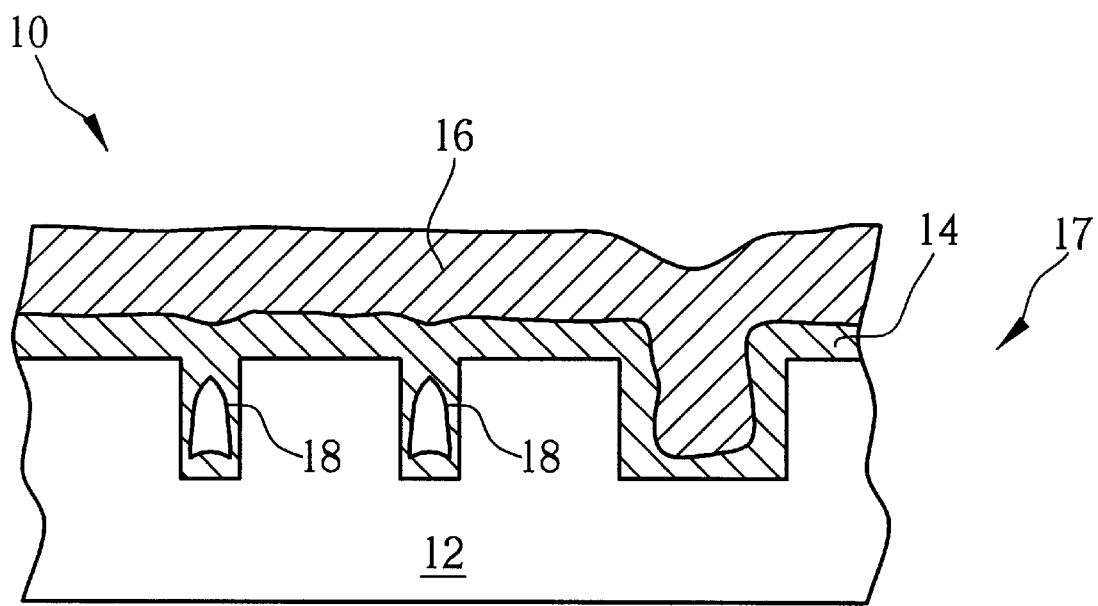
Figure 3:
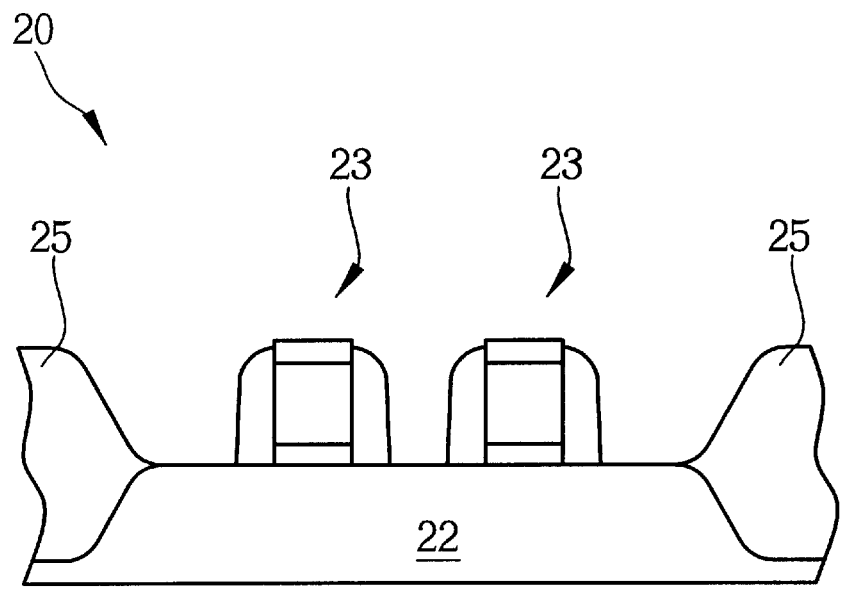
FIG. 3 and FIG. 4 are schematic diagrams of the method of positing silicon oxide layer according to the present invention.
Figure 4:
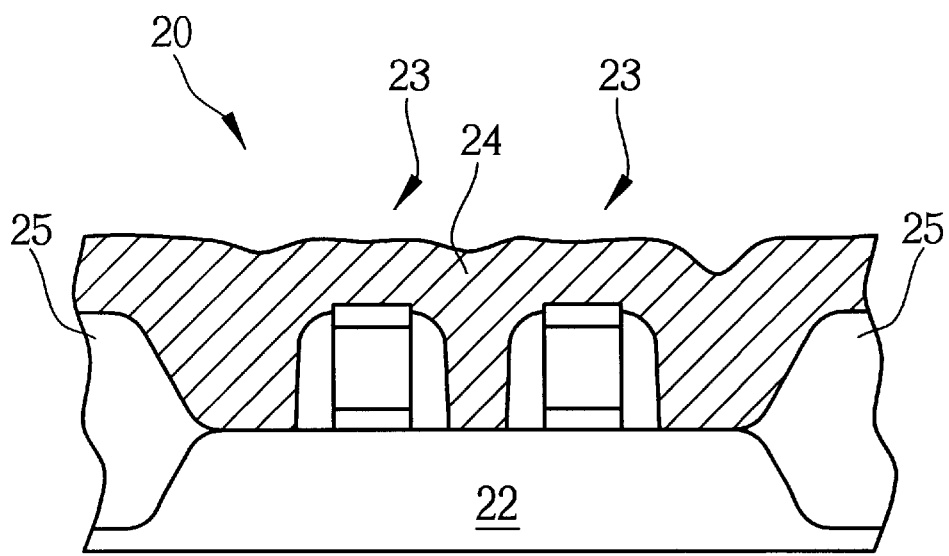

Please refer to FIG. 3 and FIG. 4. FIG. 3 and FIG. 4 are schematic diagrams of the method of depositing the silicon oxide layer 24 according to the present invention. The present invention provides a method of depositing the silicon oxide layer 24 on the semiconductor wafer 20. As shown in FIG. 3, the semiconductor wafer 20 comprises a plurality of transistors 23 positioned on the Si substrate 22 of the semiconductor wafer 20 and a field oxide (FOX) formed by $SiO_2$. Transistors 23 are comprised of polysilicon gates and SiN used as spacers.

The present invention performs a cleaning process to semiconductor wafer 20 using an alkaline solution. Then a spin-dry step is employed to completely remove the residual alkaline solution and to avoid any water mark occurrences on the semiconductor wafer 20. At last, an APCVD process is performed directly to form the silicon oxide layer 24 on the semiconductor wafer 24 by using Tetra-Ethyl-Ortho-Silicate (TEOS) and a predetermined concentration of highly concentrated ozone at around 80 to 200 g/L as the reactive gases, as shown in FIG. 4.

The alkaline solution employed in the cleaning process in the present invention consists of KOH, NaOH or $NH_4OH$, as well as $H_2O_2$, which is used as an oxidant. The cleaning process is performed on the semiconductor wafer 20 so that the surface of the Si substrate 22 of the semiconductor wafer 20 and the surfaces of each of the transistors 23 all come into contact with the alkaline solution and a chemical reaction will occur. This chemical reaction has the effect of making the deposition rates of silicon oxide layer 24 more uniform across transistors 23 and the other surfaces of the semiconductor wafer 20. So a predetermined concentration of highly concentrated ozone and TEOS gases are then employed to perform an APCVD process after the cleaning process. Moreover, because highly concentrated ozone has good gap filling abilities, the silicon oxide layer 24 can be formed with an even thickness and without voids. Under an electron microscope, it is found that the thickness of silicon oxide layer 24 formed by the present invention is very uniform and without voids.

In contrast to the prior art method of depositing the silicon oxide layer 17, the method of depositing the silicon oxide layer 24 according to the present invention is performed using an alkaline solution to clean the surface of the semiconductor wafer 20, which causes a more uniform deposition rate of the silicon oxide layer on the transistors. Then, an APCVD process is performed using highly concentrated ozone to form the silicon oxide layer 24 of an even thickness. Not only can the present invention method simplify the whole manufacturing process, but it also prevents voids. As voids can lead to defective circuits, preventing them helps to increase production yields.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of depositing a silicon oxide layer on a semiconductor wafer, the semiconductor wafer comprising a plurality of transistors positioned on its surface, the method comprising:

performing a cleaning process to the semiconductor wafer by using an alkaline solution to generate a chemical reaction; and performing a deposition process by employing ozone as a reactive gas after performing the cleaning process by using the alkaline solution to form a silicon oxide layer on the semiconductor wafer;

wherein the chemical reaction generated by the cleaning process uniforms the deposition rate of the silicon oxide layer on the transistors and other areas over the surface of the semiconductor wafer.

2. The method of claim 1 wherein the deposition process is an atmospheric pressure chemical vapor deposition (APCVD) process.

3. The method of claim 1 wherein the deposition process employs ozone and Tetra-Ethyl-Ortho-silicate (TEOS) as the reactive gases.

4. The method of claim 1 wherein the flow rate of the ozone is 80~200 g/L.

5. The method of claim 1 wherein the alkaline solution is formed by KOH, NaOH or $NH_4OH$.

6. The method of claim 5 wherein the alkaline solution further comprises $H_2O_2$.

7. The method of claim 1 wherein each of the transistors comprises silicon (Si), silicon dioxide ($SiO_2$) and silicon nitride (SiN).

* * * * *